United States Patent [19]
Park

[11] Patent Number: 6,166,672
[45] Date of Patent: Dec. 26, 2000

[54] DIGITAL/ANALOG CONVERTER AND METHOD USING VOLTAGE DISTRIBUTION

[75] Inventor: Jong-Yeong Park, Seoul, Rep. of Korea

[73] Assignee: Hyundai Electronics Industries, Co., Ltd., Ichon-shi, Rep. of Korea

[21] Appl. No.: 09/209,247

[22] Filed: Dec. 10, 1998

[30] Foreign Application Priority Data

Jan. 23, 1998 [KR] Rep. of Korea .......................... 98/2015

[51] Int. Cl.$^7$ .................................................. H03M 1/66

[52] U.S. Cl. ............................................. 341/145; 341/154

[58] Field of Search .................................. 341/155, 156, 341/154, 159

[56] References Cited

U.S. PATENT DOCUMENTS

| | | | |
|---|---|---|---|
| 5,252,975 | 10/1993 | Yuasa et al. ............................. | 341/145 |
| 5,451,952 | 9/1995 | Yamazaki et al. ...................... | 341/158 |
| 5,703,588 | 12/1997 | Rivoir et al. ............................ | 341/159 |
| 5,831,566 | 11/1998 | Ginetti .................................... | 341/144 |
| 5,977,898 | 11/1999 | Ling et al. .............................. | 341/144 |

OTHER PUBLICATIONS

Allen, Phillip et al., "CMOS Analog Circuit Design", 1987, Chapter 10, p. 532.

*Primary Examiner*—Peguy JeanPierre
*Attorney, Agent, or Firm*—Fleshner & Kim, LLP

[57] ABSTRACT

A D/A (digital/analog) converter and method are provided that includes a first switching unit having $2^N$ switches connected in parallel to respective nodes that each receive a corresponding voltage of a distributed reference voltage and being switched in accordance with an M-bit decoding signal output from the decoding unit. The $2^N$ switches of the first switching unit can be divided into $2^M$ groups each having $2^L$ switches. The distributed voltage can be provided to the respective nodes using a resistance array, a resistor string or the like. A second switching unit has $2^N$ switches connected in parallel between the first switching unit and respective output nodes and are switched in accordance with an L-bit decoding signal output from the decoding unit. The $2^N$ switches of the second switching unit can be divided into $2^M$ groups each having $2^L$ switches. A third switching unit having $2^M$ switches connected in parallel between the respective output nodes and an output terminal are switched in accordance with the M-bit decoding signal output. The converter decreases the time constant by the parasite capacitance and generates a high speed analog output voltage.

20 Claims, 3 Drawing Sheets

DIGITAL/ANALOG CONVERTER AND METHOD USING VOLTAGE DISTRIBUTION

BACKGROUND OF THE INVENTION

1. Field of the Invention

The present invention relates to a digital/analog (hereafter, "D/A") converter and in particular to a high speed resistor string D/A converter.

2. Background of the Related Art

FIG. 1 is a circuit diagram illustrating a related art D/A converter using a resistor string. The D/A converter includes a decoder 10 for decoding N-bit input data and outputting decoding signals $0 \sim 2^{N-1}$ and a resistor string 11 with a plurality $2^N+1$ resistors R coupled in series between a reference voltage Vref terminal and ground voltage Vss. A switching unit 12 has a plurality of switches $SW1 \sim SW2^N$ for outputting voltages distributed at respective nodes $1 \sim 2^N$ of the resistor string 11 to an output terminal Vout in accordance with the decoding signals $0 \sim 2^{N-1}$ from the decoder 10.

The operation of the related art D/A converter will now be described. The reference voltage Vref is distributed by the respective resistors R. Accordingly, the nodes $1 \sim 2^N$ of the resistor string 11 maintain the distributed voltage values. When an N-bit input signal is applied, the decoder 10 decodes the N-bit signal and outputs the decoding signals $0 \sim 2^{N-1}$. The switching unit 12 may be turned on or off in accordance with the decoding signals $0 \sim 2^{N-1}$ outputted from the decoder 10. Therefore, the voltages at the nodes $1 \sim 2^N$ are outputted through the turned-on switches $SW1 \sim SW2^N$ to the output terminal Vout, to generate an analog voltage having levels of $0 \sim 2^N$.

A settling time Tc, which indicates a time to stabilize the output voltage to 1/2 LSB (least significant bit) in the D/A converter, is determined by a delay time Td of the decoder 10 and a time constant T of an RC circuit. The settling time Tc may be expressed by equation 1 as follows:

$$Tc = Td + (N+1) \cdot T \cdot \ln 2 \qquad (1)$$

In equation 1, N is the number of bits.

FIG. 2 is an equivalent circuit of FIG. 1 for obtaining the time constant T of the RC circuit in equation 1. In FIG. 2, Veq and Req respectively denote an equivalent voltage and an equivalent resistance in the resistor string 11, and Ron and Cp respectively indicate a turn-on resistance and a parasitic capacitance of each of the respective switches $SW1 \sim SW2^N$. The time constant T in the equivalent circuit of FIG. 2 is approximately obtained by equation 2 as follows:

$$T = 2^N \cdot Cp(Ron + Req) + Cp \cdot Req \qquad (2)$$

If the value of the time constant T expressed in equation 2 is substituted for the time constant T in equation 1, the setting time Tc is obtained by equation 3 as follows:

$$Tc = Td + (N+1) \cdot \ln 2 \cdot [2^N \cdot Cp(Ron+Req) + Cp \cdot Req] \qquad (3)$$

However, in the related art D/A converter, if an input bit number N is not less than six ($N \geq 6$), the parasitic capacitance Cp of the output terminal Vout is increased, which increases the settling time Tc. That is, the increase of the bit number N in equation 3 satisfies $Tc \approx 2^N \cdot Cp \cdot (Ron+Req)(N+1) \cdot \ln 2$. At this time, assuming that the equivalent resistance Req of the resistor string 11 is sufficiently smaller than a turn-on resistance Ron of the switches $SW1 \sim SW2^N$, the setting time Tc may be approximately expressed by equation 4 as follows:

$$Tc \approx 2^N \cdot Cp \cdot Ron(N+1) \cdot \ln 2 \qquad (4)$$

As described above, the related art D/A converter has various disadvantages. The D/A related art converter has a disadvantage in that the increase of a bit number N causes the settling time Tc to increase in proportion to $2^N(N+1)$.

The above references are incorporated by reference herein where appropriate for appropriate teachings of additional or alternative details, features and/or technical background.

SUMMARY OF THE INVENTION

An object of the present invention is to provide a D/A converter and method that substantially obviates at least one of the problems caused by disadvantages of the related art.

Another object of the present invention is to provide a D/A converter and method that decreases a time constant caused by a parasitic capacitance.

Another object of the present invention is to provide a D/A converter and method that increases an operational speed.

Another object of the present invention is to provide a high speed D/A converter and method using a resistor string.

Another object of the present invention is to provide a high speed D/A converter and method using a voltage distribution method that enables a high speed operation by decreasing a parasitic capacitance time constant.

To achieve at least the above-described objects in a whole or in parts there is provided a D/A converter according to the present invention that includes a decoding unit that decodes an N-bit input into an L-bit signal and an M-bit signal, a first switching unit having a first plurality of switches coupled in parallel to corresponding ones of a plurality of nodes, wherein the first plurality of switches are switched in accordance with an M-bit decoding signal output from the decoding unit, and a second switching unit having a second plurality of switches coupled in parallel to corresponding ones of the first plurality of switches and an output terminal, wherein the second plurality of switches are switched in accordance with an L-bit decoding signal output from the decoding unit.

To further achieve at least the above-described objects in a whole or in parts there is provided D/A converter according to the present invention that includes a decoding unit that divides an N-bit input into an L-bit signal and an M-bit signal, a resistance array that distributes a reference voltage using a plurality of resistances coupled in series between the reference voltage and a prescribed voltage, a first switching unit having $2^N$ switches coupled in parallel to respective nodes located between adjacent resistances of the plurality of resistances and being switched in accordance with an M-bit decoding signal output from the decoding unit, wherein the number $2^N$ of switches are divided into $2^M$ groups each having $2^L$ switches, a second switching unit having $2^N$ switches coupled in parallel between one of the $2^N$ switches of the first switching unit and respective output nodes of the $2^M$ groups and being switched in accordance with an L-bit decoding signal output from the decoding unit to select one of the $2^L$ switches in the $2^M$ groups and a third switching unit having $2^M$ switches coupled in parallel between respective ones of the $2^M$ output nodes and an output terminal, wherein the $2^M$ switches of the third switching unit are switched in accordance with the M-bit decoding signal.

To further achieve at least the above-described objects in a whole or in parts there is provided method of performing a D/A conversion according to the present invention that includes decoding an N-bit input into an L-bit decoding signal and an M-bit decoding signal, distributing a reference voltage among a plurality of nodes, switching a first plurality of switches coupled in parallel to corresponding ones of the plurality of nodes, wherein the first plurality of switches are switched in accordance with the M-bit decoding signal, and switching a second plurality of switches coupled in parallel to corresponding of the first plurality of switches and an output terminal, wherein the second plurality of switches are switched in accordance with the L-bit decoding signal.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 1:
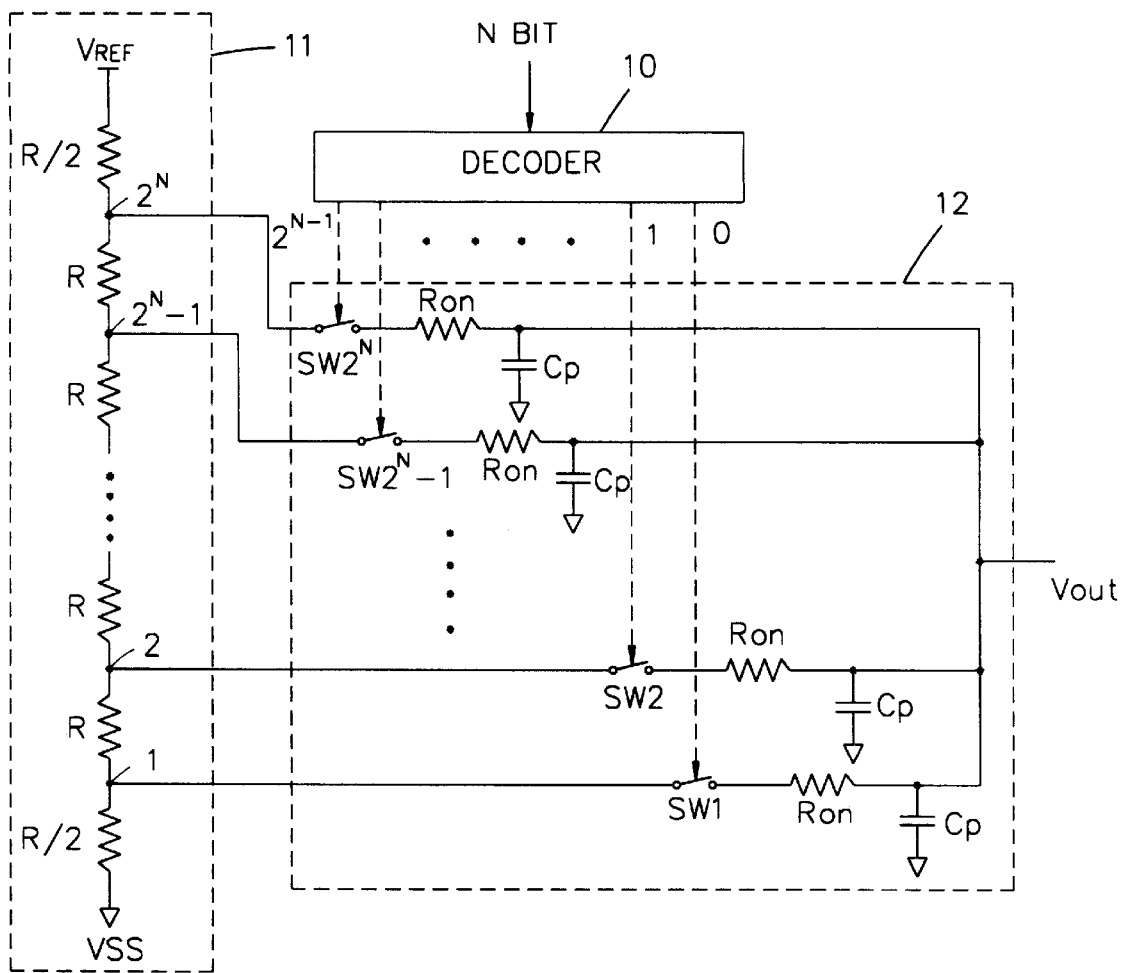
FIG. 1 is a circuit diagram illustrating a related art D/A converter using voltage distribution.
Figure 2:
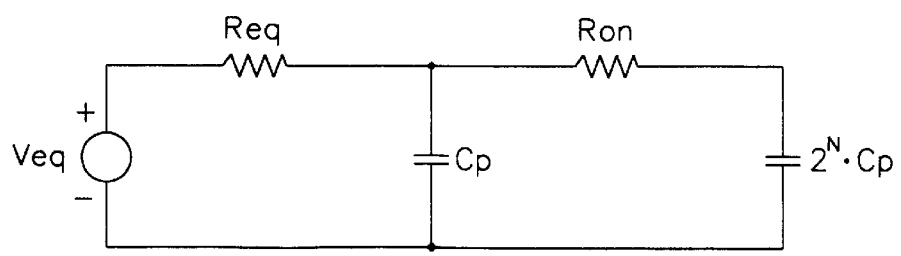
FIG. 2 is a circuit diagram illustrating an RC equivalent circuit in the D/A circuit of FIG. 1.
Figure 3:
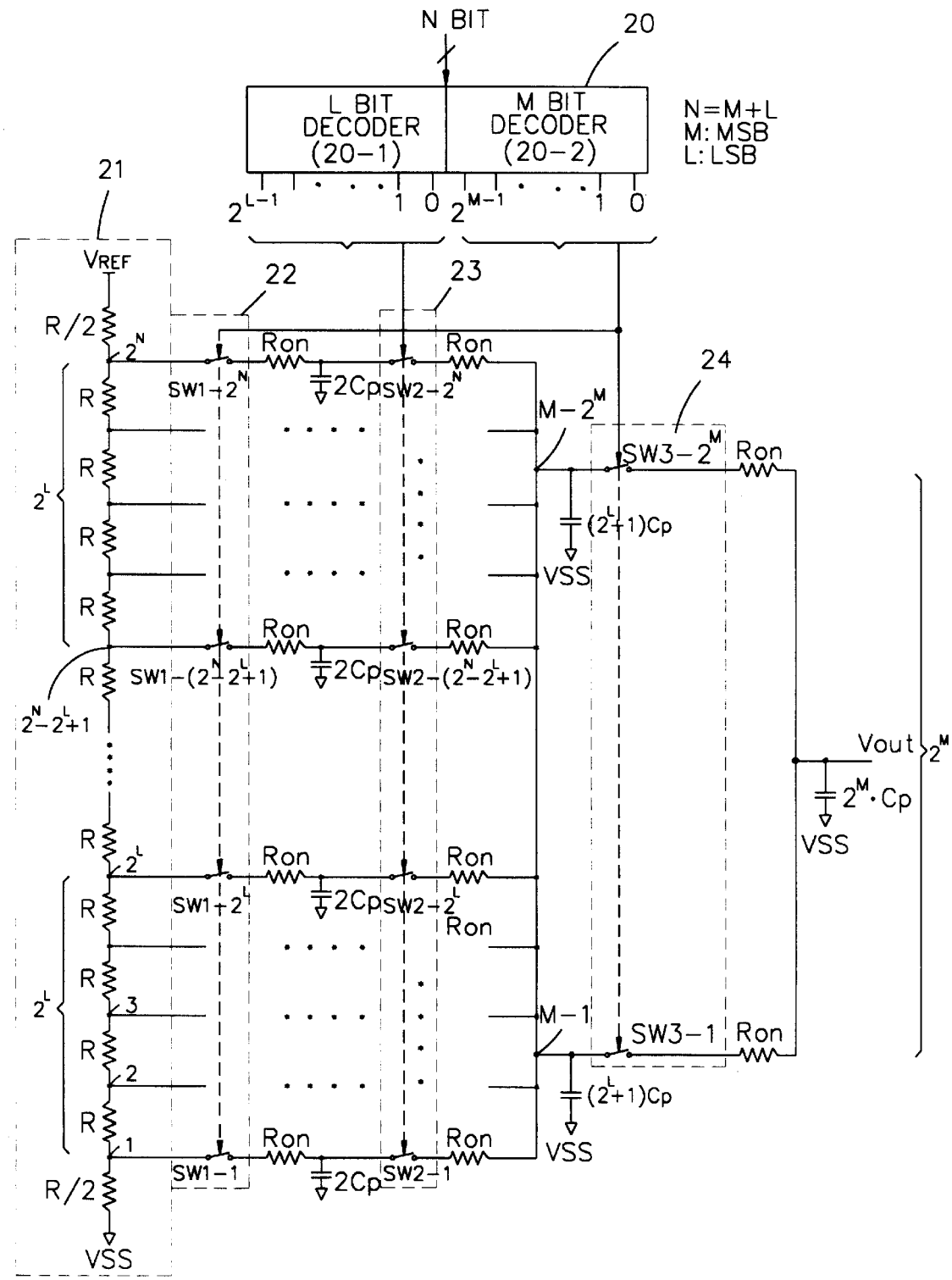
FIG. 3 is a circuit diagram illustrating a D/A converter using voltage distribution according to a preferred embodiment of the present invention.

FIG. 3 is a circuit diagram illustrating a D/A converter using a voltage distribution method according to a preferred embodiment of the present invention. As shown in FIG. 3, a decoding unit 20 includes an L-bit decoder 20-1 and an M-bit decoder 20-2. In the decoding unit 20, an N-bit input is preferably divided into a first group of L bits and a second group of M bits for the two respective decodings. In a resistance array 21, a plurality $2^N+1$ resistances R are coupled in series between reference voltage Vref and ground voltage Vss to distribute the reference voltage Vref.

A first switching unit 22 switches respective distributed voltages received from the resistance array 21 in accordance with the decoding signal of the M-bit decoder 20-2. A second switching unit 23 switches respective output voltages of the first switching unit 22 in accordance with the decoding signal of the L-bit decoder 20-1. A third switching unit 24 switches respective output voltages of the second switching unit 22 in accordance with the decoding signal of the M-bit decoder 20-2, and the switched value from the third switching unit 24 is output through an output terminal Vout.

A plurality of switches SW1-1~SW1-$2^N$ of the first switching unit 22 are coupled in parallel in $2^M$ groups of $2^L$ to respective nodes 1~$2^N$ of the resistance array 21. A plurality of switches SW2-1~SW2-$2^N$ of the second switching unit 23 are coupled in parallel in $2^M$ groups of $2^L$ between the first switching unit 22 and $2^M$ output nodes M-1~M-$2^M$. A plurality of switches SW3-1~SW3-$2^M$ of the third switching unit 24 are coupled in parallel between the $2^M$ output nodes M-1~M-$2^M$ and the output terminal Vout.

Operations of the D/A converter according to the preferred embodiment of the present invention will now be described. The L-bit decoder 20-1 and the M-bit decoder 20-2 in the decoding unit 20 divides the N-bit input into an L-bit group and an M-bit group, which output decoding signals 0~$2^{L-1}$, 0~$2^M$, respectively. The respective nodes 1~$2^N$ of the resistance array 11 maintain the voltage distributed by the plurality of resistances R.

With regard to the switches SW1-1~SW1-$2^N$ of the first switching unit 22, a number $2^L$ of switches provided in one of the $2^M$ groups are turned on (e.g., selected) in accordance with the decoding signals 0~$2^{M-1}$ output from the M-bit decoder 20-2, and the other switches are turned off. As a result, the paths other than for the number $2^L$ of switches in the selected one of the $2^M$ groups are interrupted. Accordingly, a time constant resulting from a parasite capacitance of the other switches (e.g., in the non-selected $2^M$ groups) is possibly eliminated.

In the switches SW2-1~SW2-$2^N$ of the second switching unit 23, only one switch selected from a number $2^L$ of switches provided in one of the $2^M$ groups is turned on (e.g., the group selected by the first switching unit 22) in accordance with the decoding signals 0~$2^{L-1}$ output from the L-bit decoder 20-1 to select one voltage level of a number $2^L$ of voltage levels output from the first switching unit 22. Further, only one switch in the switches SW3-1~SW3-$2^N$ of the third switching unit 24 is turned on in accordance with the decoding signals 0~$2^M$ output from the M-bit decoder 20-2. Consequently, one voltage level is selected by the M-bit decoder 20-2 among the number $2^L$ of voltage levels received through the resistance array 21 and the second switching unit 23 to decrease the parasite capacitance of a number $2^N-(2^L+3\cdot2^M)$ of switches in comparison to the related art.

For example, assuming that N=8 bits, L=5 bits, M=3 bits are satisfied, L-bit decoder 20-1 outputs a number $2^5$ of decoding signals with regard to the 5-bit input, and the M-bit decoder 20-2 outputs a number $2^3$ of decoding signals using the 3-bit input. Also, a number $2^8$ of switches in the first and second switching units 22, 23 form groups of $2^5$. Here, the number of groups equals $2^3$.

Therefore, in accordance with the decoding signal output from the M-bit decoder 20-2, only one switch SW3-x among the number $2^3$ of switches SW3-1~SW3-8 is turned on. Accordingly one voltage of the number $2^5$ of voltages output from the second switching unit 23 is output through the output terminal Vout.

That is, in the preferred embodiment a number $2^L$ of switches of the $2^N$ switches SW1-1~SW1-$2^N$ in the first switching unit 22 are turned on in accordance with the coding signal of the M-bit decoder. In the second switching unit 23, only one of the corresponding number $2^L$ of turned on switches of the second switching unit 23 are turned on in accordance with the coding signal of the L-bit decoder. Also, in the third switching unit 24, only one of the number $2^M$ of switches are turned on in accordance with the coding signal of the M-bit decoder, whereby an analog voltage having a number 1~$2^N$ of levels is generated.

Figure 4:
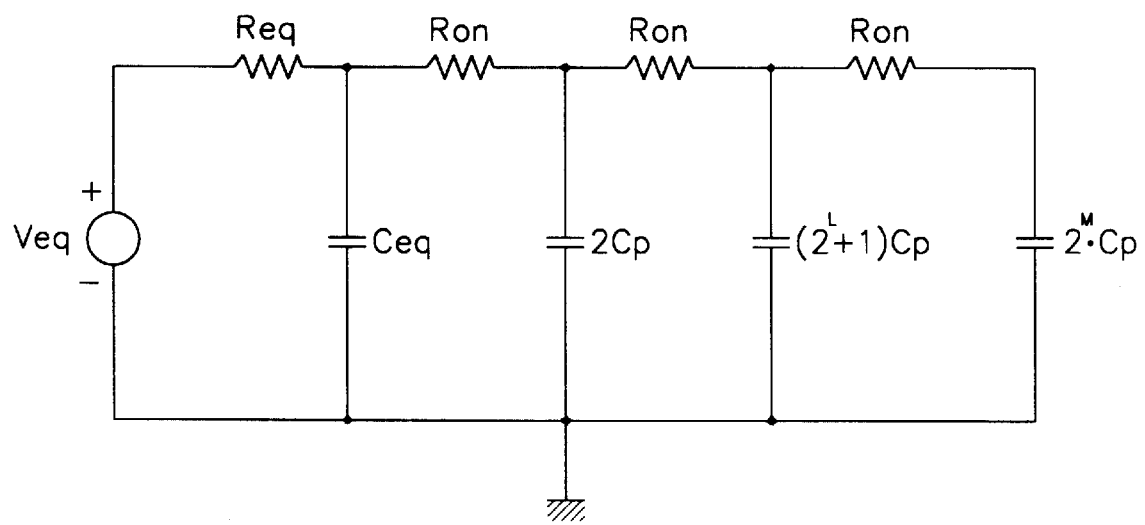
FIG. 4 is a circuit diagram illustrating an RC equivalent circuit in the D/A circuit of FIG. 3.

FIG. 4 is a circuit diagram illustrating an RC equivalent circuit of the D/A circuit in the circuit of FIG. 3 for obtaining a time constant T. In FIG. 4, Veq denotes an equivalent voltage distributed by the resistance array 21, Req denotes an equivalent resistance of the resistance array 21, Ron denotes a turn-on resistance of a switch, Ceq denotes an equivalent parasite capacitance of the resistance array 21 and the switch, and Cp denotes a parasite capacitance of the switch. With reference to the equivalent circuit of FIG. 4, an approximate value of the time constant T is obtained by equation 5 as follows:

$$T = Cp \cdot Req + 2Cp(Ron+Req) + (2^L+1)Cp(2Ron+Req) + 2^M \cdot Cp(3Ron+Req) \quad (5)$$

Assuming that the equivalent resistance Req of the resistance array 21 is sufficiently smaller than the turn-on resistance Ron, the settling time Tc is obtained as equation 6 by substituting equation 5 in equation 1 as follows:

$$Tc = Td + (N+1) \cdot \ln 2 \cdot [Cp \cdot Req + 2Cp(Ron+Req) + (2^L+1)Cp(2Ron+Req) + 2^M Cp(2Ron+Req)] \quad (6)$$

When the input bit N is sufficiently large, the settling time Tc may be approximately obtained by equation 7 as follows:

$$Tc \approx (2^L + 3 \cdot 2^M) Cp \cdot Ron(N+1) \ln 2 \quad (7)$$

By comparing equation 4 of $Tc \approx 2^N \cdot Cp \cdot Ron(N+1)\ln 2$ according to the related art D/A converter with equation 7 of $Tc \approx (2^L + 3 \cdot 2^M) Cp \cdot Ron(N+1)\ln 2$ according to the preferred embodiment of the present invention, and in a case that $N \geq 6$, M=L are satisfied, the settling time Tc of the preferred embodiment is significantly decreased relative to the related art.

For example, in case of N=10, L=M=5, the settling time of the related art, when standardized at $(N+1) \cdot Cp \cdot Ron \ln 2$, satisfies $2^N = 1024$, whereas the settling time of the preferred embodiment satisfies $2^L + 3 \cdot 2^N = 2^5 + 3 \cdot 2^5 = 128$. As a result, the settling time Tc of the present invention is eight times (=1024/128) faster than that of the related art. However, the preferred embodiment is not intended to be limited to M=L.

As described above, a preferred embodiment of a D/A converter and method according to the present invention has various advantages. The preferred embodiment of the D/A converter and method using a resistance array decreases a time constant caused by a parasite capacitance to generate an analog output voltage in a high speed (i.e., decreased interval) with regard to the digital input. Further, the D/A converter according to a preferred embodiment divides the applied N-bit input into L-bit decoder and M-bit decoder for decoding the N-bit input. Accordingly, only a subset (e.g., $2^L$) of switches in a first switching unit coupled to a plurality of points in the resistance array are turned on in accordance with the decoding signal of the M-bit decoder. Further, only one of the (e.g., $2^L$) corresponding switches in a second switching unit are turned on in accordance with the decoding signal of the L-bit decoder. Also, one of the switches (e.g., $2^M$ switches) in a third switching unit are turned on in accordance with the decoding signal of the M-bit decoder to decrease the parasite capacitance by the switching in a number of $2^N - (2^L + 3 \cdot 2^M)$. In addition, a preferred embodiment of the present invention decreases the time constant by the parasite capacitance of the switches so that a settling time Tc when a 10 bit input signal is received, becomes eight times faster than the related art.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A D/A converter, comprising:
   a decoding unit that decodes an N-bit input into an L-bit signal and an M-bit signal;
   a first switching unit having a first plurality of switches each coupled at a first terminal to a corresponding one of a plurality of nodes, wherein each of the first plurality of switches are switched in accordance with an M-bit decoding signal output from the decoding unit; and
   a second switching unit having a second plurality of switches, wherein a first terminal of each of the second plurality of switches is coupled in series to a second terminal of a single one of the first plurality of switches, and wherein series coupled pairs of the first and second plurality of switches are coupled in parallel to the corresponding one of the plurality of nodes and an output terminal, wherein the second plurality of switches are switched in accordance with an L-bit decoding signal output from the decoding unit.

2. The D/A converter of claim 1, wherein the first plurality of switches has $2^N$ switches divided into $2^M$ groups each having $2^L$ switches, wherein the second plurality of switches has $2^N$ switches divided into $2^L$ groups each having $2^M$ switches.

3. The D/A converter of claim 2, wherein the selected switches provided in each of the groups of the first switching unit are simultaneously turned on by the M-bit decoding signal.

4. The D/A converter of claim 2, wherein the $2^L$ switches provided in one of $2^M$ groups of the first switching unit and one switch selected from $2^L$ switches provided in one of the $2^M$ groups in the second switching unit are enabled.

5. The D/A converter of claim 1, further comprising:
   a third switching unit having $2^M$ switches coupled in parallel between respective output nodes of the $2^M$ groups and the output terminal, wherein the $2^M$ switches of the third switching unit are switched in accordance with an M-bit decoding signal output from the decoding unit.

6. The D/A converter of claim 5, further comprising a resistance array that having a plurality of resistances coupled in series between a first prescribed voltage and a second prescribed voltage, wherein the resistance array distributes a voltage difference between the first and second prescribed voltages among the plurality of nodes, wherein one of the $2^L$ switches provided in each of the groups of the first plurality of switches is turned on in accordance with the M-bit decoding signal, and one of the $2^M$ switches provided in each of the groups of the second plurality of switches is turned on in accordance with the L-bit decoding signal.

7. The D/A converter of claim 6, wherein each of the resistances are equal in size, wherein the first prescribed voltage is a reference voltage and the second prescribed voltage is a ground voltage, and wherein L=M.

8. The D/A converter of claim 5, wherein M does not equal L.

9. The D/A converter of claim 1, wherein a reference voltage is distributed among the respective nodes.

10. The D/A converter of claim 1, wherein M does not equal L.

11. The D/A converter of claim 1, further comprising only one resistance array that distributes a reference voltage using a plurality of resistors coupled in series by the plurality of nodes, respectively, wherein the resistance array is connected between first and second prescribed voltages.

12. A D/A converter, comprising:
   a decoding unit that divides an N-bit input into an L-bit signal and an M-bit signal;
   a resistance array that distributes a reference voltage using a plurality of resistances coupled in series between the reference voltage and a prescribed voltage;
   a first switching unit having $2^N$ switches coupled in parallel to respective nodes located between adjacent resistances of the plurality of resistances and being switched in accordance with an M-bit decoding signal output from the decoding unit, wherein the number $2^N$ of switches are divided into $2^M$ groups each having $2^L$ switches;

a second switching unit having $2^N$ switches coupled in parallel between one of the $2^N$ switches of the first switching unit and respective output nodes of the $2^M$ groups and being switched in accordance with an L-bit decoding signal output from the decoding unit to select one of the $2^L$ switches in the $2^M$ groups; and a third switching unit having $2^M$ switches coupled in parallel between respective ones of the $2^M$ output nodes and an output terminal, wherein the $2^M$ switches of the third switching unit are switched in accordance with the M-bit decoding signal.

13. The D/A converter of claim 12, wherein each of the resistances are equal in size, wherein the prescribed voltage is a ground voltage, and wherein L=M.

14. The D/A converter of claim 12, wherein M does not equal L.

15. The D/A converter of claim 12, wherein selected switches provided in each of the groups of the first switching unit are simultaneously turned on by the M-bit decoding signal.

16. A method of performing a D/A conversion, comprising:

decoding an N-bit input into an L-bit decoding signal and an M-bit decoding signal;

distributing a reference voltage among a plurality of nodes;

switching a first plurality of switches coupled in parallel to corresponding ones of the plurality of nodes, wherein the first plurality of switches are switched in accordance with the M-bit decoding signal;

switching a second plurality of switches coupled in parallel to corresponding ones of the first plurality of switches and an output terminal, wherein the second plurality of switches are switched in accordance with the L-bit decoding signal; and switching a third plurality of $2^M$ switches coupled in parallel between respective output nodes of $2^M$ groups and the output terminal, wherein the $2^M$ switches of the third switching unit are switched in accordance with the M-bit decoding signal output from the decoding unit.

17. The method of claim 16, wherein the first plurality of switches has $2^N$ switches divided into $2^M$ groups each having $2^L$ switches, and wherein the second plurality of switches has $2^N$ switches divided into $2^L$ groups each having $2^M$ switches.

18. The method of claim 17, wherein one of the $2^L$ switches provided in each of the groups of the first plurality of switches is turned on in accordance with the M-bit decoding signal, and one of the $2^M$ switches provided in each of the groups of the second plurality of switches is turned on in accordance with the L-bit decoding signal, and wherein L=M.

19. The method of claim 17, wherein a first switching unit has the first plurality of switches each coupled at a first terminal to a single one of the plurality of nodes, and wherein a second switching unit has the second plurality of switches, wherein a first terminal of each of the second plurality of switches is coupled in series to a second terminal of a single one of the first plurality of switches, and wherein series coupled pairs of the first and second plurality of switches are coupled in parallel to the corresponding single one of the plurality of nodes and the output terminal.

20. The method of claim 17, wherein the $2^L$ switches provided in a selected one of said $2^M$ groups of the first plurality of switches and one switch selected from the $2^M$ switches provided in one of the $2^L$ groups in the second switching unit, which is connected to the selected $2^M$ group are enabled.

* * * * *